United States Patent
Cirigliano et al.

(10) Patent No.: US 7,772,122 B2
(45) Date of Patent: Aug. 10, 2010

(54) SIDEWALL FORMING PROCESSES

(75) Inventors: Peter Cirigliano, Sunnyvale, CA (US); Helen Zhu, Fremont, CA (US); Ji Soo Kim, Pleasanton, CA (US); S. M. Reza Sadjadi, Saratoga, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 12/233,517

(22) Filed: Sep. 18, 2008

(65) Prior Publication Data

US 2010/0068885 A1    Mar. 18, 2010

(51) Int. Cl.
*H01L 21/311* (2006.01)

(52) U.S. Cl. .................. 438/696; 438/699; 438/702; 430/313

(58) Field of Classification Search .......... 438/694, 438/696, 699, 700, 702, 945, 946, 947; 430/311, 430/313, 314, 317
See application file for complete search history.

(56) References Cited

U.S. PATENT DOCUMENTS 4,871,630 A * 10/1989 Giammarco et al. .......... 430/14
5,895,740 A * 4/1999 Chien et al. .................. 216/46
6,100,014 A * 8/2000 Lin et al. .................... 438/696
7,250,371 B2 7/2007 Kang et al.
7,271,108 B2 9/2007 Sadjadi
2006/0257750 A1 11/2006 Sadjadi et al.
2006/0266478 A1 11/2006 Lee et al.
2007/0042607 A1 2/2007 Sadjadi et al.

OTHER PUBLICATIONS

U.S. Appl. No. 61/016,368, filed Dec. 21. 2007.
International Search Report dated Apr. 15, 2010 from International Application No. PCT/US2009/056716.
Written Opinion dated Apr. 15, 2010 from International Application No. PCT/US2009/056716.

* cited by examiner

*Primary Examiner*—Kevin M Picardat
(74) *Attorney, Agent, or Firm*—Beyer Law Group LLP (57) ABSTRACT

An etch layer underlying a patterned photoresist mask is provided. A plurality of sidewall forming processes are performed. Each sidewall forming process comprises depositing a protective layer on the patterned photoresist mask by performing multiple cyclical depositions. Each cyclical deposition involves at least a depositing phase for depositing a deposition layer over surfaces of the patterned photoresist mask and a profile shaping phase for shaping vertical surfaces in the deposition layer. Each sidewall forming process further comprises a breakthrough etch for selectively etching horizontal surfaces of the protective layer with respect to vertical surfaces of the protective layer. Afterwards, the etch layer is etched to form a feature having a critical dimension that is less than the critical dimension of the features in the patterned photoresist mask.

22 Claims, 8 Drawing Sheets

SIDEWALL FORMING PROCESSES

BACKGROUND OF THE INVENTION

The present invention relates to the formation of semiconductor devices.

During semiconductor wafer processing, features of the semiconductor device are defined in the wafer using well-known patterning and etching processes. In these processes, a photoresist (PR) material is deposited on the wafer and then is exposed to light filtered by a reticle. The reticle is generally a glass plate that is patterned with exemplary feature geometries that block light from propagating through the reticle.

After passing through the reticle, the light contacts the surface of the photoresist material. The light changes the chemical composition of the photoresist material such that a developer can remove a portion of the photoresist material. In the case of positive photoresist materials, the exposed regions are removed, and in the case of negative photoresist materials, the unexposed regions are removed.

SUMMARY OF THE INVENTION

To achieve the foregoing and in accordance with the purpose of the present invention, a method for forming a feature in an etch layer underlying a patterned photoresist mask is described. A plurality of sidewall forming processes are performed. Each sidewall forming process comprises depositing a protective layer on the patterned photoresist mask by performing multiple cyclical depositions. Each cyclical deposition involves at least a depositing phase for depositing a deposition layer over surfaces of the patterned photoresist mask and a profile shaping phase for shaping vertical surfaces in the deposition layer. Each sidewall forming process further comprises a breakthrough etch for selectively etching horizontal surfaces of the protective layer with respect to vertical surfaces of the protective layer. Afterwards, the etch layer is etched to form a feature having a critical dimension that is less than the critical dimension of the features in the patterned photoresist mask.

In another embodiment of the invention, an apparatus for forming a feature in an etch layer underlying a patterned photoresist mask is provided. The apparatus comprises a plasma processing chamber. The plasma processing chamber includes a chamber wall forming a plasma processing chamber enclosure, a substrate support for supporting a substrate within the plasma processing chamber enclosure, a pressure regulator for regulating the pressure in the plasma processing chamber enclosure, one or more electrodes for providing power to the plasma processing chamber enclosure for sustaining a plasma, a gas inlet for providing gas into the plasma processing chamber enclosure and a gas outlet for exhausting gas from the plasma processing chamber enclosure. The plasma processing chamber also includes a gas source in fluid connection with the gas inlet. The gas source comprises a depositing gas source, a profile shaping gas source, a breakthrough gas source and a feature etching gas source. The plasma processing chamber also includes a controller that is connected to the gas source and the electrode(s). The controller includes one or more processors and computer readable media. The computer readable media comprises computer readable code for performing a plurality of sidewall forming processes and computer readable code for performing one of the plurality of sidewall forming processes. The latter code includes computer readable code for depositing a protective layer on the patterned photoresist mask by performing a plurality of cyclical depositions and computer readable code for performing one cyclical deposition. The latter code includes computer readable code for a depositing phase for depositing a deposition layer over surfaces of the patterned photoresist mask and computer readable code for a profile shaping phase for shaping vertical surfaces in the deposition layer. The computer readable code for performing one of the plurality of sidewall forming processes further comprises computer readable code for selectively etching horizontal surfaces of the protective layer with respect to vertical surfaces of the deposition layer. The computer readable media further comprises computer readable code for etching the etch layer to form a feature therein, such that the feature in the etch layer has a smaller critical dimension than the critical dimension of the features of the patterned photoresist mask.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

The invention involves depositing protective material over a patterned photoresist mask to form features with small critical dimensions (CD). More specifically, the invention provides features with CDs that are less than the CD of the patterned photoresist mask used to etch the feature. Additionally, the invention helps manage the buildup of protective material on large open areas of the patterned photoresist mask. If such buildup reaches a certain critical thickness, problems such as cracking, flaking and/or delamination may occur.

Figure 1A:
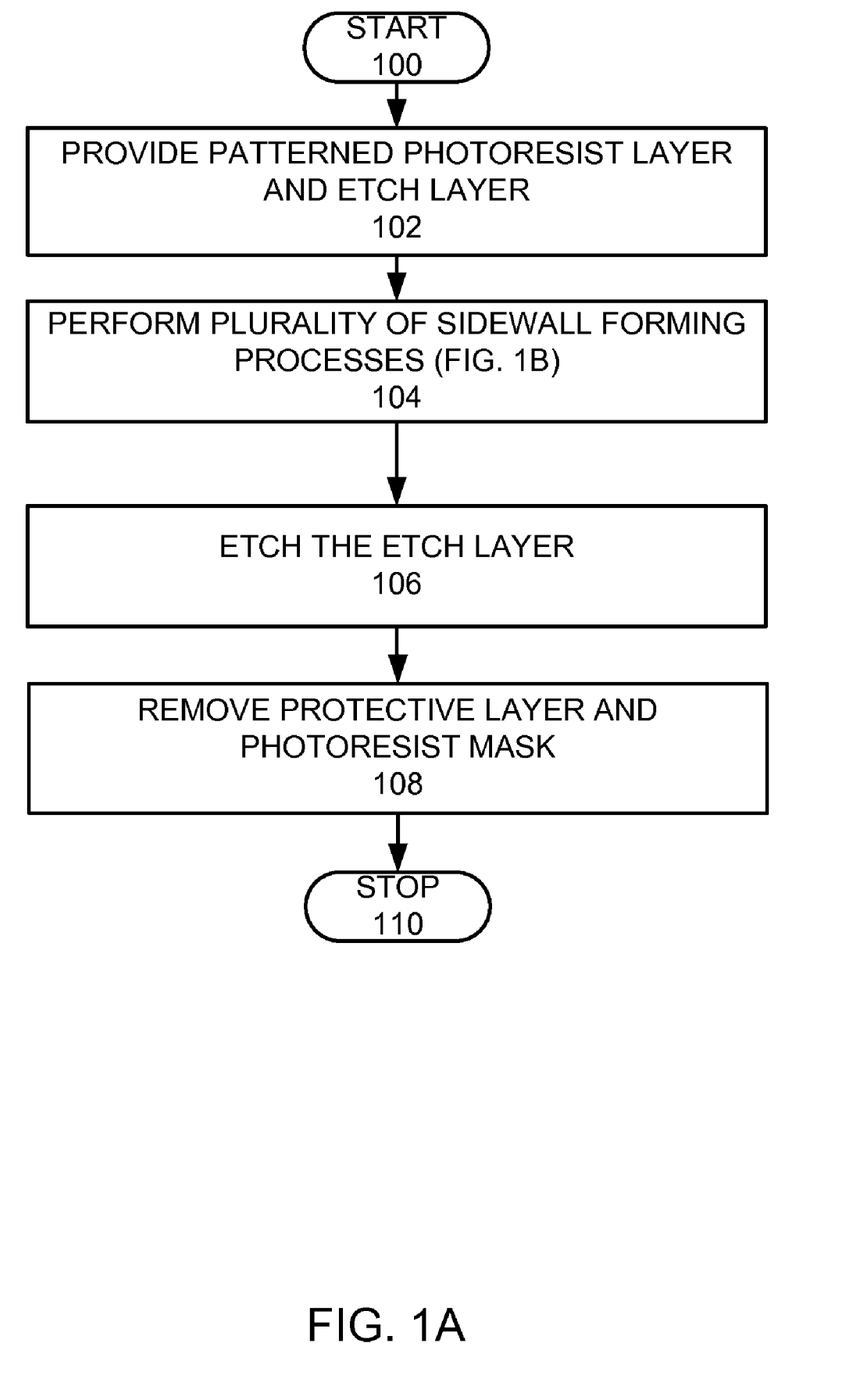
FIG. 1A-1B are high level flow charts of processes that may be used in an embodiment of the invention.
Figure 2A:
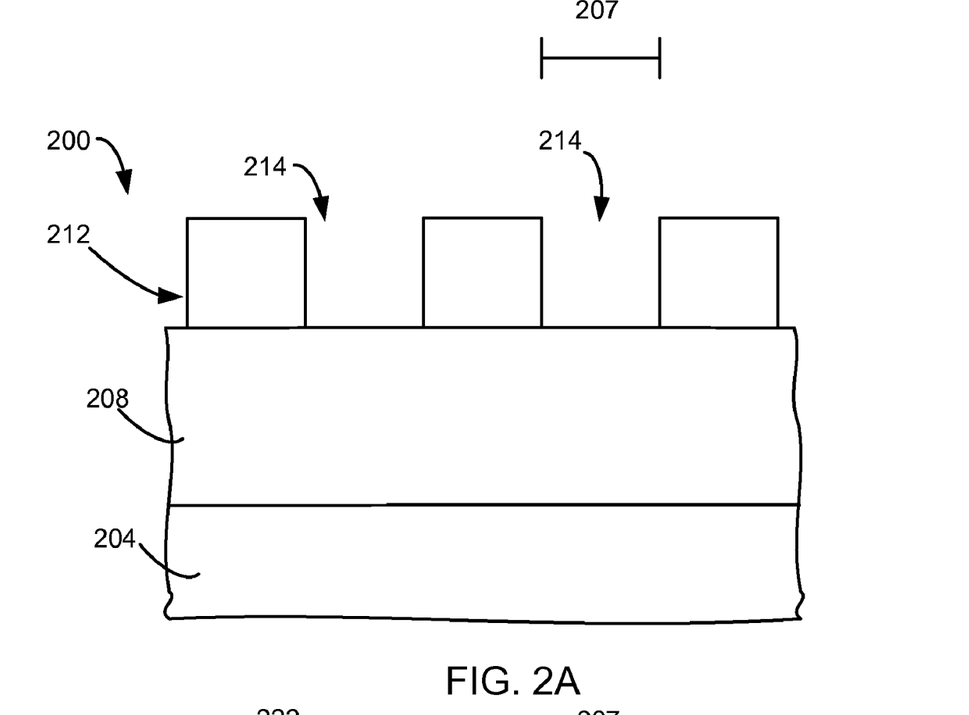
FIGS. 2A-G are schematic cross-sectional views of semiconductor wafer layers processed according to an embodiment of the invention.

To facilitate understanding, FIG. 1A is a high level flow chart of a process that may be used in an embodiment of the invention. A patterned photoresist layer and etch layer are provided (step 102). FIG. 2A is a schematic cross-sectional view of an etch layer 208 over a substrate 204. A patterned photoresist mask 212 with mask features 214 is over the etch layer 208, which forms a stack 200. The mask features 214 have critical distance 207. An optional BARC or ARL (anti-reflective layer) may be placed between the substrate and the photoresist mask.

Figure 1B:
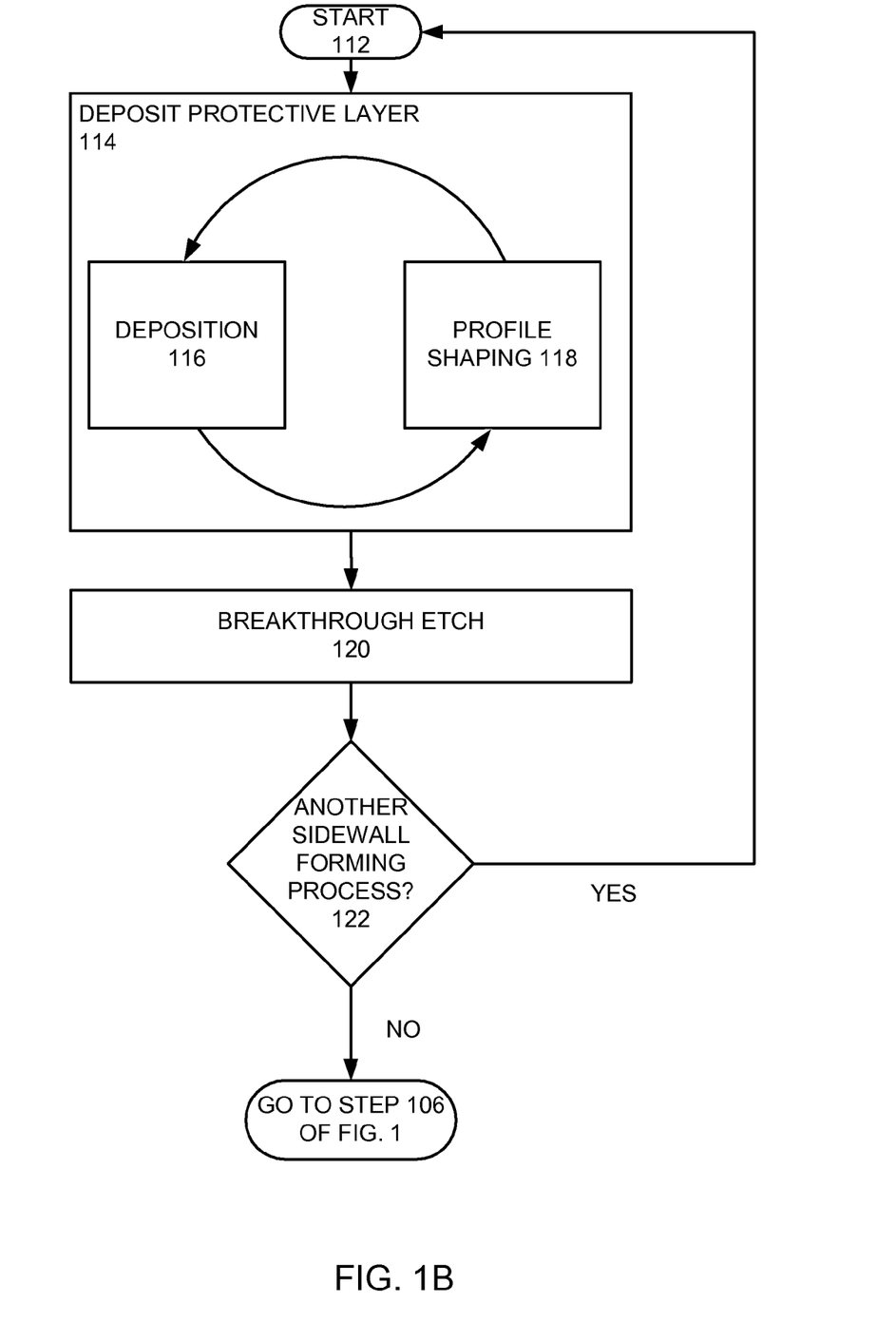
Figure 2B:
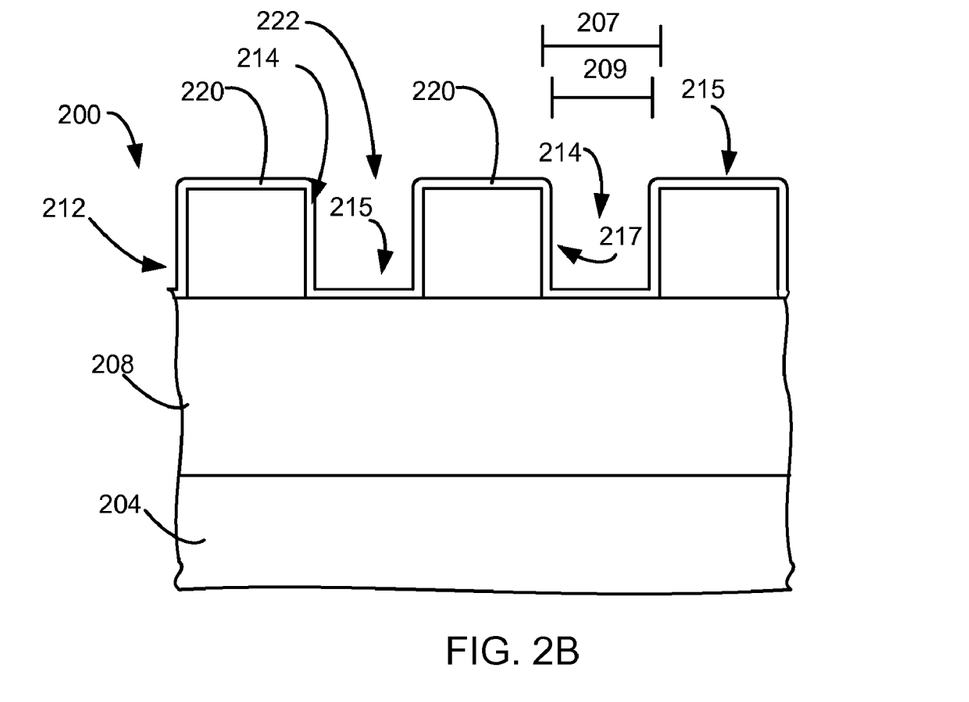

Multiple sidewall forming processes are then performed (step 104.) FIG. 1B is a high-level flow chart of a sidewall forming process that may be used in an embodiment of the invention. A protective layer is deposited using a cyclical process (step 114). Each cycle comprises at least the two steps of depositing a layer over the sidewalls of the photoresist mask features 214 (step 116) and then shaping the profile and vertical surfaces of the deposited layer (step 118). FIG. 2B is a schematic cross-sectional view of the patterned photoresist mask 212 with a protective layer 220, which was formed by one cycle of the protective layer formation process. Protective layer 220 includes sidewalls 217, horizontal open areas 215 and protective layer features 222 within the mask features 214. Protective layer features 222 have critical dimension 209, which is smaller than critical dimension 207 of mask features 214.

Figure 2C:
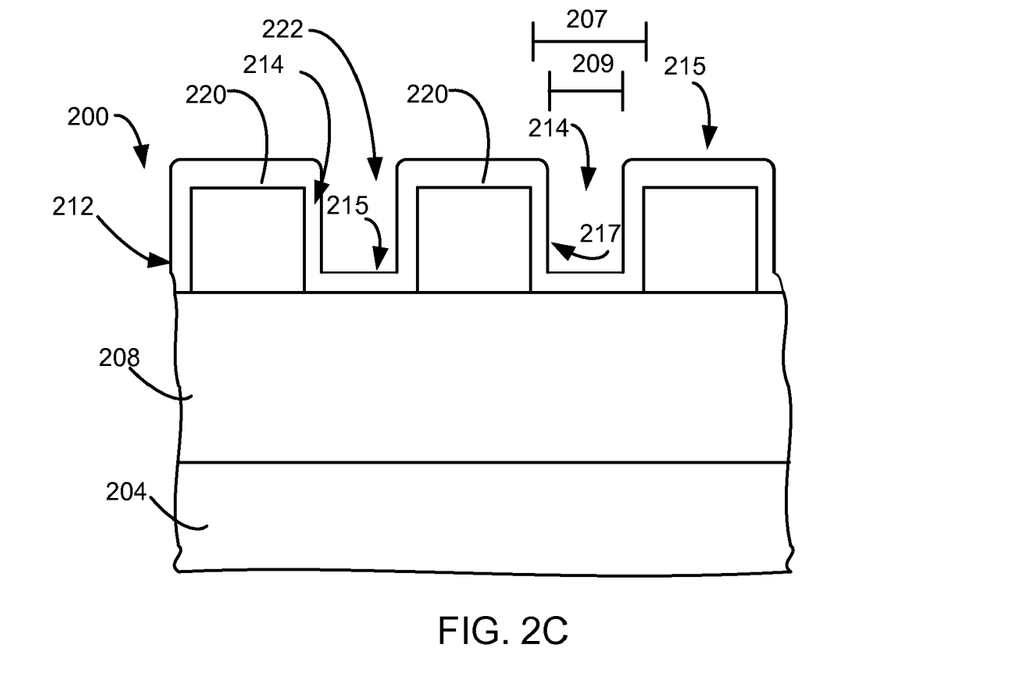

The deposition of the protective layer involves multiple cycles. FIG. 2C shows the effect of an additional cycle on the stack 200 illustrated in FIG. 2B. In the illustrated embodiment, sidewalls 217 and horizontal open areas 215 of protective layer 220 have thickened substantially, causing critical distance 209 to decrease further. As noted earlier, if the accumulation of protective layer 220 in open areas 215 was allowed to proceed unchecked, various problems may arise. For example, the protective layer 220 may crack, flake and/or release contaminants. Other possible problems include a lifting of the protective layer and/or a deterioration of the photoresist pattern.

Figure 2D:
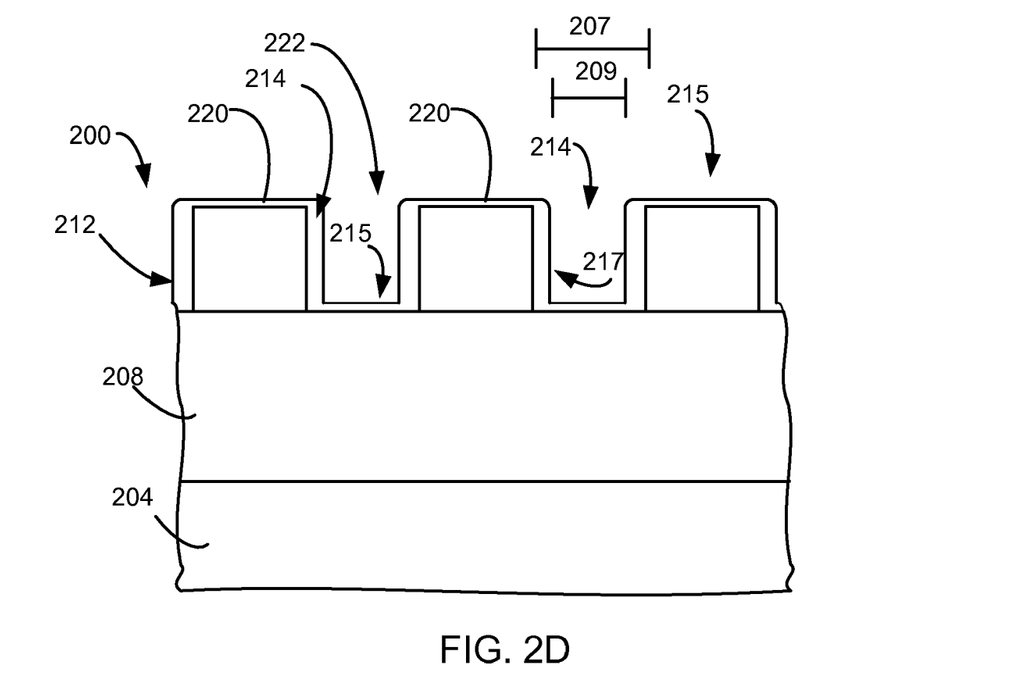

The sidewall forming process also includes a breakthrough etch, which is performed after the completion of the cyclical protective layer formation process (step 120). The breakthrough etch involves selectively etching horizontal surfaces of the protective layer 220 with respect to vertical surfaces of the protective layer. FIG. 2D is a schematic cross-sectional view of the stack 200 illustrated in FIG. 2C after a breakthrough etch. The thickness of protective layer 220 in open areas 215 has been substantially reduced. The protective layer 220 along sidewalls 217, however, has been minimally reduced. Open areas 215 have been etched at a disproportionately greater rate than the sidewalls 217. Accordingly, critical dimension 209 has not decreased greatly. (It should be appreciated that the drawings in this application are not to scale. The relative size of certain illustrated features may be exaggerated for the purpose of clarity.)

The degree of etching of open areas 215 may differ depending on the needs of a particular application. In some embodiments, the breakthrough etch only partially removes the protective layer 220 that overlies a horizontal surface of photoresist layer 212. That is, the breakthrough etch does not break through the protective layer 220 but does reduce its thickness substantially. In certain applications this is advantageous, because it prevents the underlying layer (e.g. etch layer 208) from damage. In alternative embodiments, the breakthrough etch removes substantially all protective layer material from at least some of the open areas 215, thus exposing a portion of the underlying layer (e.g. etch layer 208 or photoresist layer 212.) Preferably, for complete breakthrough processes the breakthrough is highly selective to the deposition layer with respect to the underlying layer.

Figure 2E:
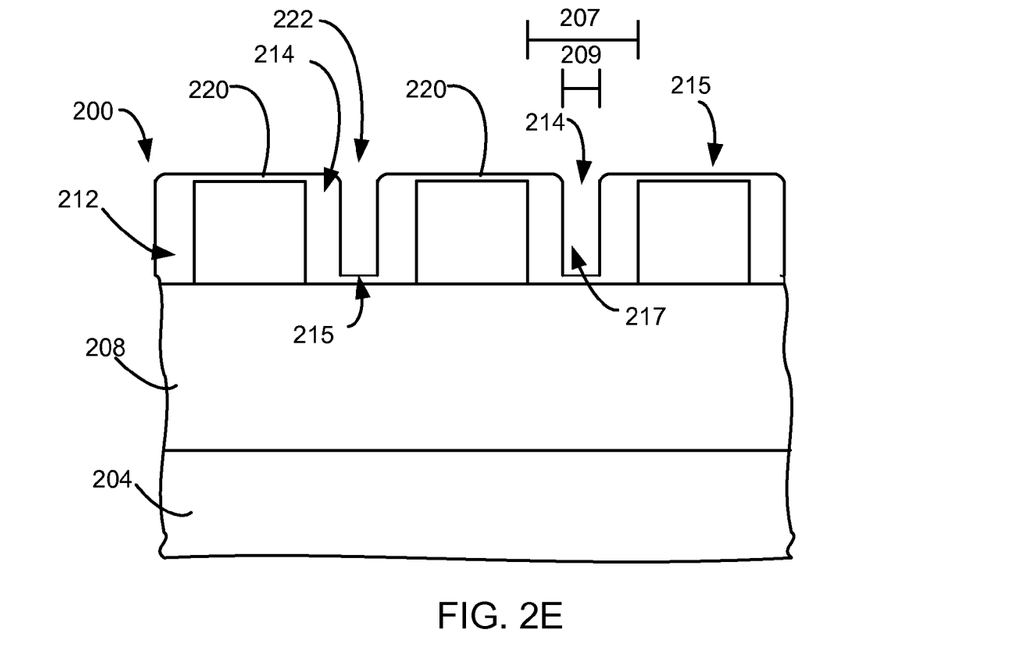

After a breakthrough etch, another sidewall forming process may be performed (step 122 of FIG. 1B). Generally, at least two sidewall forming processes are performed. FIG. 2E is a schematic cross-sectional view of stack 200 after the performance of a second sidewall forming process. In comparison to stack 200 of FIG. 2D, protective layer 220 on sidewalls 217 is substantially thicker, while the growth of protective layer 220 on open areas 215 has been minimized. The use of multiple sidewall forming processes reduces critical distance 209 of protective layer feature 222 while at the same time limiting the buildup of protective layer 220 on open areas 215.

Figure 2F:
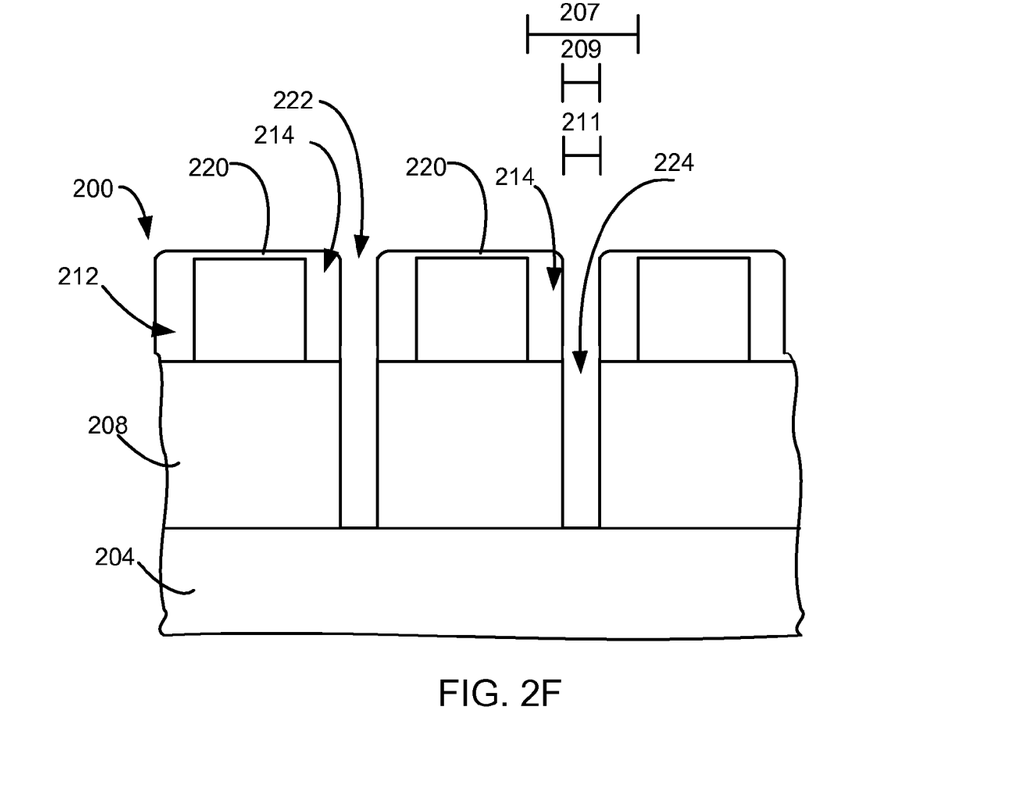

After multiple sidewall forming processes have been performed, the etch layer is etched (step 106 of FIG. 1A.) FIG. 2F shows feature 224 etched into etch layer 208. In this example, the feature 224 etched in etch layer 208 has a CD 211, which is equal to the CD 209 of the protective layer feature 222. In practice, the CD 211 of the feature 224 may be slightly larger than the CD 209 of the feature 222 of the deposited protective layer 220. However, since the CD 209 of the deposited protective layer feature 222 is significantly smaller than the CD 207 of the photoresist 212, the CD 211 of the feature 224 in the etch layer 208 is still smaller than the CD 207 of the photoresist 212. Preferably, the CD 211 of the feature 224 of the etch layer 208 is at least approximately 50% less than the CD 207 of the photoresist feature.

Figure 2G:
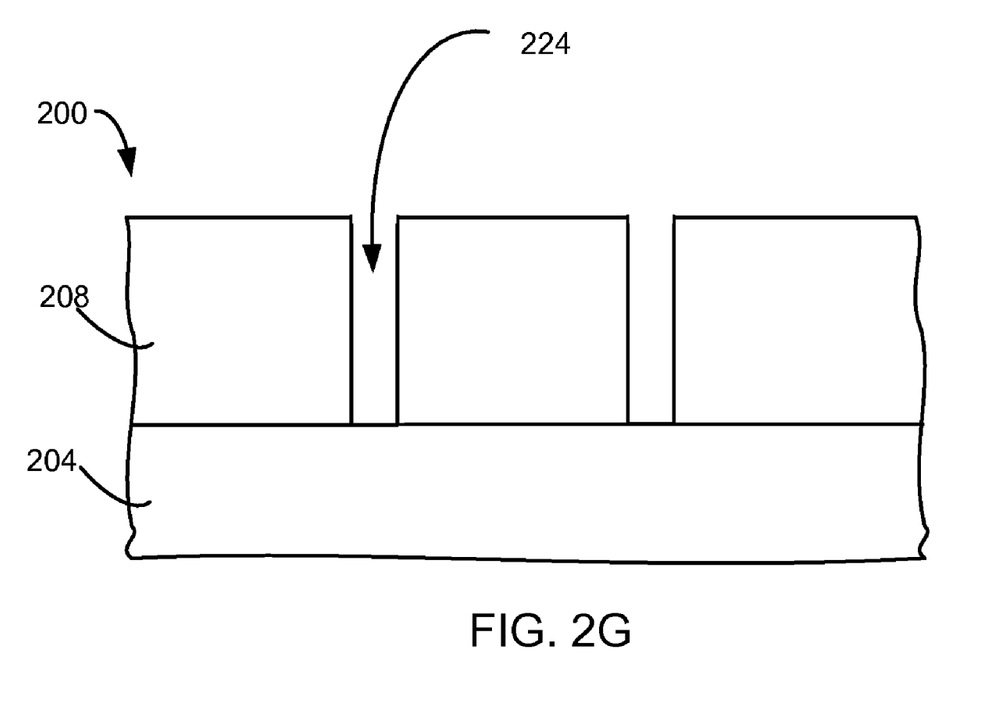

The photoresist and deposited protective layer may then be removed (step 108 of FIG. 1A). This may be done as a single step or two separate steps with a separate protective layer removal step and photoresist removal step. Ashing may be used for the removal process. FIG. 2G shows the stack 200 after the protective layer and photoresist mask have been removed. Additional formation steps may be performed. For example, a contact may then be formed in the feature. To provide a dual damascene structure, a trench may be etched before the contact is formed. Additional processes may be performed after the contact is formed.

Example of Implementing Sidewall Forming Processes

In an example of the invention, a patterned photoresist mask of 193 nm photoresist overlying an etch layer 208 of a semiconductor wafer (step 102) is provided. In an alternative embodiment, the patterned photoresist mask is made of 193 nm immersion photoresist. Photoresist mask features are formed in the patterned photoresist mask 212. Presently, for 248 nm photoresist mask a typical CD for the photoresist may be 250-130 nm, using conventional processes. The substrate is placed in a plasma processing chamber.

Figure 3:
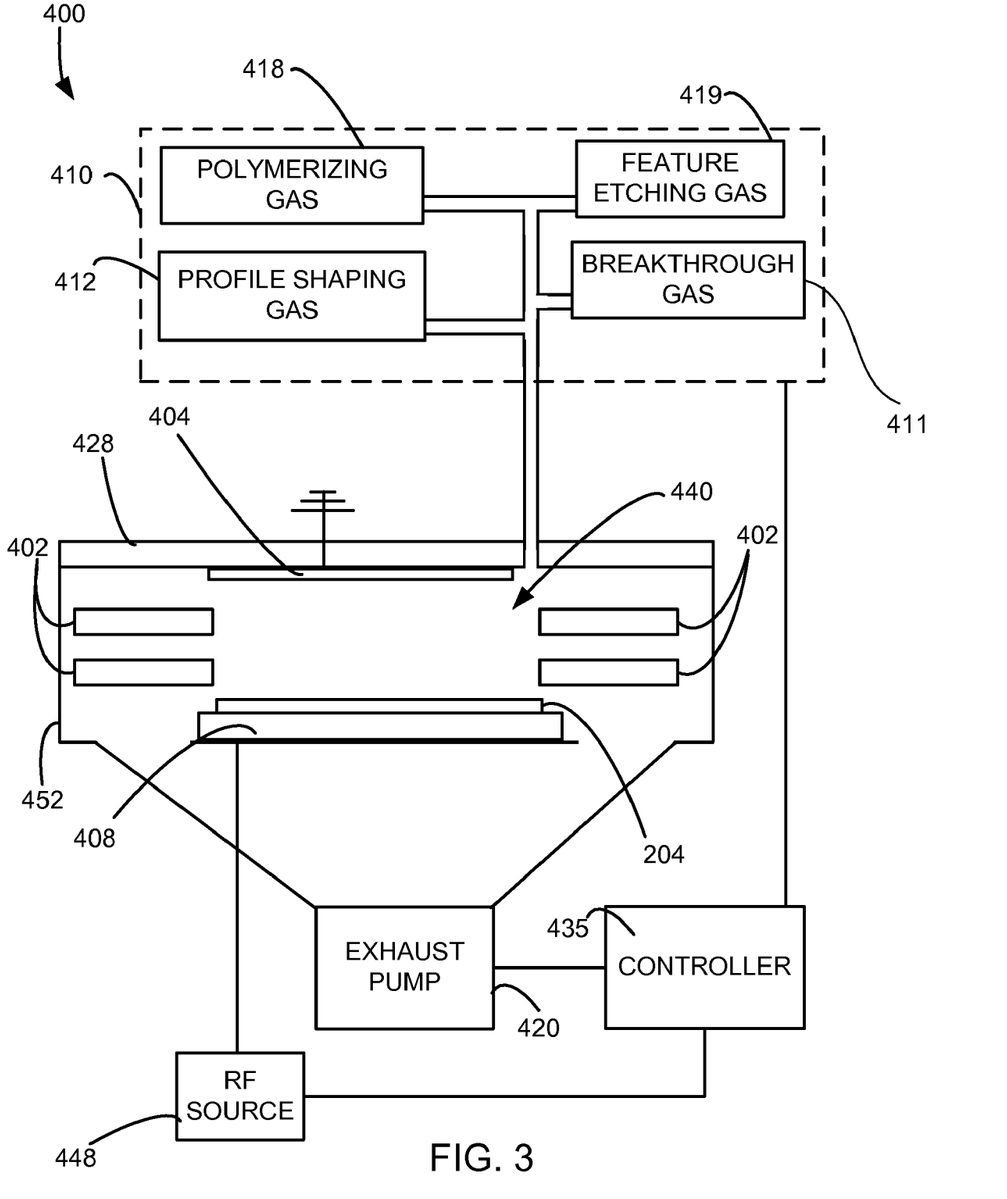
FIG. 3 is a schematic view of a plasma processing chamber that may be used in practicing the invention.

FIG. 3 is a schematic view of a plasma processing chamber 400 that may be used for opening the organic ARC layer and etching the features in this example. The plasma processing chamber 400 comprises confinement rings 402, an upper electrode 404, a lower electrode 408, a gas source 410, and an exhaust pump 420. The gas source 410 comprises a profile shaping gas source 412, a polymerizing gas source 418, a breakthrough gas source 411 and a gas source for etching features in the etch layer 419, if the features are etched in the same process chamber. The gas source 410 may comprise additional gas sources. Within plasma processing chamber 400, the substrate 204 is positioned upon the lower electrode 408. The lower electrode 408 incorporates a suitable substrate chucking mechanism (e.g., electrostatic, mechanical clamping, or the like) for holding the substrate 204. The reactor top 428 incorporates the upper electrode 404 disposed immediately opposite the lower electrode 408. The upper electrode 404, lower electrode 408, and confinement rings 402 define the confined plasma volume 440. Gas is supplied to the confined plasma volume 440 by the gas source 410 and is exhausted from the confined plasma volume 440 through the confinement rings 402 and an exhaust port by the exhaust pump 420. An RF source 448 is electrically connected to the lower electrode 408. The upper electrode 404 is grounded. Chamber walls 452 surround the confinement rings 402, the upper electrode 404, and the lower electrode 408. The RF source 448 may comprise one or more source frequencies, e.g. a 27 MHz power source and/or a 2 MHz power source and/or a 60 MHz power source. Different combinations of connecting RF power to the electrode are possible in other embodiments, such as having an RF source connected to the upper electrode 404. In the case of Motif™, which is basically the same as a Flex45™ with a rapid gas modulation assembly, made by LAM Research Corporation™ of Fremont, Calif., which may be used in a preferred embodiment of the invention, all three of the 60 MHz, 27 MHz, and 2 MHz source frequencies make up the RF power source 448 connected to the lower electrode, and the upper electrode 404 is grounded. A controller 435 is controllably connected to the RF source 448, exhaust pump 420, and the gas source 410.

Figure 4A:
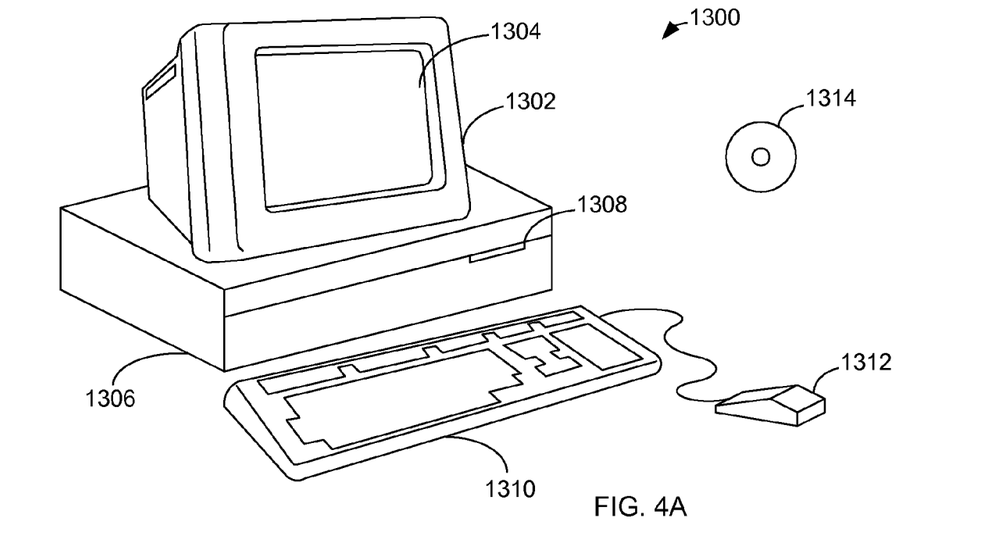
FIGS. 4A-B illustrate a computer system, which is suitable for implementing a controller used in embodiments of the present invention.
Figure 4B:
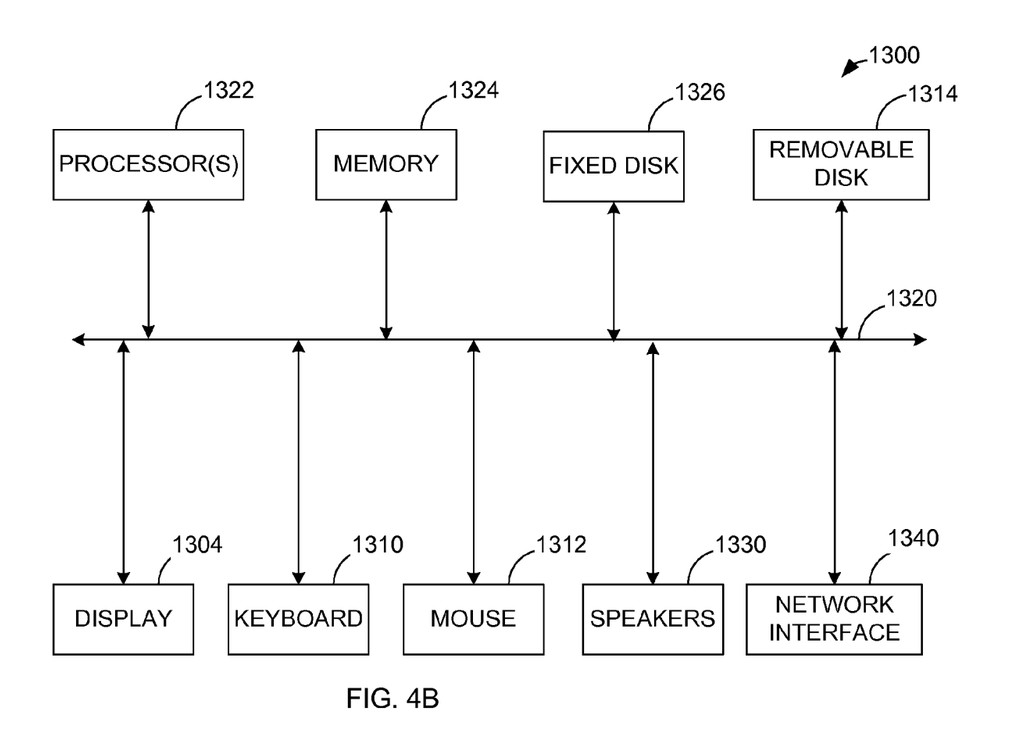

FIG.'S 4A and 4B illustrate a computer system 1300, which is suitable for implementing a controller 435 used in embodiments of the present invention. FIG. 4A shows one possible physical form of the computer system. Of course, the computer system may have many physical forms ranging from an integrated circuit, a printed circuit board, and a small handheld device up to a huge super computer. Computer system 1300 includes a monitor 1302, a display 1304, a housing 1306, a disk drive 1308, a keyboard 1310, and a mouse 1312. Disk 1314 is a computer-readable medium used to transfer data to and from computer system 1300.

FIG. 4B is an example of a block diagram for computer system 1300. Attached to system bus 1320 is a wide variety of subsystems. Processor(s) 1322 (also referred to as central processing units, or CPUs) are coupled to storage devices, including memory 1324. Memory 1324 includes random access memory (RAM) and read-only memory (ROM). As is well known in the art, ROM acts to transfer data and instructions uni-directionally to the CPU and RAM is used typically to transfer data and instructions in a bi-directional manner. Both of these types of memories may include any of the computer-readable media described below. A fixed disk 1326 is also coupled bi-directionally to CPU 1322; it provides additional data storage capacity and may also include any of the computer-readable media described below. Fixed disk 1326 may be used to store programs, data, and the like and is typically a secondary storage medium (such as a hard disk) that is slower than primary storage. It will be appreciated that the information retained within fixed disk 1326 may, in appropriate cases, be incorporated in standard fashion as virtual memory in memory 1324. Removable disk 1314 may take the form of any of the computer-readable media described below.

CPU 1322 is also coupled to a variety of input/output devices, such as display 1304, keyboard 1310, mouse 1312 and speakers 1330. In general, an input/output device may be any of: video displays, track balls, mice, keyboards, microphones, touch-sensitive displays, transducer card readers, magnetic or paper tape readers, tablets, styluses, voice or handwriting recognizers, biometrics readers, or other computers. CPU 1322 optionally may be coupled to another computer or telecommunications network using network interface 1340. With such a network interface, it is contemplated that the CPU might receive information from the network, or might output information to the network in the course of performing the above-described method steps. Furthermore, method embodiments of the present invention may execute solely upon CPU 1322 or may execute over a network such as the Internet in conjunction with a remote CPU that shares a portion of the processing.

In addition, embodiments of the present invention further relate to computer storage products with a computer-readable medium that have computer code thereon for performing various computer-implemented operations. The media and computer code may be those specially designed and constructed for the purposes of the present invention, or they may be of the kind well known and available to those having skill in the computer software arts. Examples of fixed computer-readable media include, but are not limited to: magnetic media such as hard disks, floppy disks, and magnetic tape; optical media such as CD-ROMs and holographic devices; magneto-optical media such as floptical disks; and hardware devices that are specially configured to store and execute program code, such as application-specific integrated circuits (ASICs), programmable logic devices (PLDs) and ROM and RAM devices. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor.

Other examples may use other devices to carry out the invention.

Next, multiple sidewall forming processes are performed (step 104). In the first iterative sequence of a sidewall forming process, the first cycle in the cyclical formation of the protective layer is performed (step 114). In this example, the deposition phase (step 116) comprises providing a deposition gas and generating a plasma from the deposition gas to form a deposition layer. In this example, the deposition gas comprises a polymer forming recipe. An example of such a polymer forming recipe is a hydrocarbon gas such as, $C_2H_2$, $CH_4$ and $C_2H_4$, and/or a fluorocarbon gas, such as $CH_3F$, $CH_2F_2$, $CHF_3$, $C_4F_6$, and $C_4F_8$. In some embodiments, an auxiliary gas such as $N_2$, $H_2$ or Ar may be included in the polymer forming recipe. Another example of a polymer forming recipe would be a fluorocarbon chemistry and a hydrogen containing gas, such as a recipe of $C_2H_4$ and $N_2$. The deposition gas is then stopped.

The profile shaping (step 118) comprises providing a profile shaping gas and generating a profile shaping plasma from the profile shaping gas to shape the profile of the deposition layer. The profile shaping gas is different from the deposition gas. As illustrated, the deposition phase (step 116) and the profile shaping phase (step 118) occur at different times. In this example the profile shaping gas comprises a fluorocarbon chemistry, such as $CF_4$, $CHF_3$, and $CH_2F_2$. Other gases such as COS, $O_2$, $N_2$, and $H_2$ may be used or added. In this example, power is supplied at 0 watts at 2 MHz and 300-800 watts at 60 or 27 MHz. The profile shaping gas is then stopped.

Afterwards, a second cycle in the cyclical formation of the protective layer is performed. As a result, the deposition phase (step 116) is repeated a second time. The same deposition recipe is used here as described above. In alternative embodiments, the deposition recipe can also be modified from the recipe in the first deposition phase.

The profile shaping phase (step 118) is repeated a second time. The same profile shaping recipe is used here as described above. The profile shaping recipe can also be modified from the recipe in the first deposition phase.

The protective layer formation process (step 114) can repeat for a number of cycles until the desired protective layer is formed. Preferably, in this example, the number of cycles may be from 1 to 13 times. More preferably, the number of cycles is 2 to 6 times. Preferably, thickness of sidewalls of the protective layer are dependent on the dimensional shrink requirements. Preferably the thicknesses of the sidewalls of the protective layer are between 5 nm to 30 nm. More preferably, sidewalls of the protective layer are 15 nm to 25 nm.

This first iterative sequence of a sidewall forming process also includes a breakthrough etch (step 120). The breakthrough etch comprises providing a breakthrough gas and generating a breakthrough plasma from the breakthrough gas to selectively etch horizontal surfaces of the protective layer with respect to vertical surfaces of the protective layer. As illustrated, the breakthrough etch (step 120) occurs at different times from the deposition phase (step 116) and the profile shaping phase (step 118). In this example the breakthrough gas comprises a fluorocarbon chemistry, such as $CF_4$. Other gases such as COS, $O_2$, $N_2$, and $H_2$ may be used or added. In this example, power is supplied at 0 watts at 2 MHz and 300-800 watts at 60 or 27 MHz. The profile shaping gas is then stopped. The breakthrough gas is then stopped.

Afterward, a second iterative sequence of the sidewall forming process is performed (step 122.) As a result, deposition phase 116 and profile shaping 118 phase are each repeated at least twice and at least another breakthrough etch 120 is performed. Additional iterative sequences of the sidewall forming process may be performed until the protective layer features assume their desired dimensions. The parameters of any substep in each sidewall forming process (e.g. the deposition phase 116 and the profile shaping phase 118 of the cyclical protective layer formation process and the breakthrough etch 120) may vary depending on the needs of a particular application. For example, the types of gas and power settings in any one substep may differ or remain the same relative to any other substep. Typically, the final breakthrough etch (step 120) clears the remaining protective layer 220 at the bottom of features 222 prior to the subsequent underlayer etch step.

The etch layer is then etched (step 106.) Afterward, the protective layer and photoresist mask is removed (step 108). Examples of a photoresist mask that could remove the protective layer and photoresist mask would be a chemical strip or a strip with a plasma formed from $O_2$ or $N_2/H_2$. Additional formation steps may also be performed (step 120).

Preferably, each deposition layer for each deposition phase is between 0.5 to 30 nm thick. More preferably, each deposition layer for each deposition phase is between 0.5 nm to 5 nm thick. Most preferably, each deposition layer for each deposition phase is between 1 to 5 nm thick. Preferably, the formation of the protective layer is performed for 1 to 13 cycles. More preferably, the formation of the protective layer is performed for 2 to 6 cycles.

Particular embodiments involve depositing the protective layer on top of a patterned photoresist mask. In one embodiment of the invention, the protective layer is of a carbon and hydrogen material.

While this invention has been described in terms of several preferred embodiments, there are alterations, permutations, and various substitute equivalents, which fall within the scope of this invention. It should also be noted that there are many alternative ways of implementing the methods and apparatuses of the present invention. It is therefore intended that the following appended claims be interpreted as including all such alterations, permutations, and various substitute equivalents as fall within the true spirit and scope of the present invention.

What is claimed is:

1. A method for forming a feature in an etch layer below a patterned photoresist mask having photoresist features, the photoresist features having a first critical dimension, the method comprising:
    performing a plurality of sidewall forming processes, each of the plurality of sidewall forming processes comprising:
        depositing a protective layer on the patterned photoresist mask by performing a plurality of cyclical depositions, each of the plurality of cyclical depositions comprising:
            a depositing phase for depositing a deposition layer over surfaces of the patterned photoresist mask; and
            a profile shaping phase including shaping vertical surfaces in the deposition layer; and
        selectively etching horizontal surfaces of the protective layer with respect to vertical surfaces of the deposition layer; and
    etching the etch layer to form a feature therein, the feature in the etch layer having a second critical dimension that is less than the first critical dimension.

2. The method, as recited in claim 1, wherein the depositing phase comprises:
    flowing a depositing gas;
    forming the depositing gas into a plasma; and
    stopping the flow of the depositing gas.

3. The method, as recited in claim 2, wherein the profile shaping phase comprises:
    flowing a profile shaping gas;
    forming the profile shaping gas into a plasma; and
    stopping the flow of the profile shaping gas.

4. The method, as recited in claim 3, wherein the selective etching of the horizontal surfaces of the protective layer comprises:
    flowing a breakthrough gas;
    forming the breakthrough gas into a plasma; and
    stopping the flow of the breakthrough gas.

5. The method, as recited in claim 4, wherein the selective etching of the horizontal surfaces of the protective layer comprises completely removing portions of the protective layer overlying a horizontal surface of the patterned photoresist mask.

6. The method, as recited in claim 4, wherein the selective etching of the horizontal surfaces of the protective layer comprises partially removing portions of the protective layer overlying a horizontal surface of the patterned photoresist mask.

7. The method, as recited in claim 6, wherein the protective layer has sidewalls with a thickness between 5 nm and 30 nm.

8. The method, as recited in claim 6, wherein the second critical dimension is at least approximately 50% less than the first critical dimension.

9. The method, as recited in claim 6, wherein the depositing of the protective layer forms the protective layer on top of the patterned photoresist mask.

10. The method, as recited in claim 6, comprising removing the protective layer and photoresist mask.

11. An apparatus for forming a feature in an etch layer below a patterned photoresist mask having photoresist features, the photoresist features having a first critical dimension, comprising:
    a plasma processing chamber, comprising:
        a chamber wall forming a plasma processing chamber enclosure;

a substrate support for supporting a substrate within the plasma processing chamber enclosure;

a pressure regulator for regulating the pressure in the plasma processing chamber enclosure;

at least one electrode for providing power to the plasma processing chamber enclosure for sustaining a plasma;

a gas inlet for providing gas into the plasma processing chamber enclosure; and a gas outlet for exhausting gas from the plasma processing chamber enclosure;

a gas source in fluid connection with the gas inlet, comprising:
a depositing gas source;
a profile shaping gas source;
a breakthrough gas source; and
a feature etching gas source;

a controller controllably connected to the gas source and the at least one electrode, comprising:
at least one processor; and
computer readable media, comprising:
computer readable code for performing a plurality of sidewall forming processes;
computer readable code for performing one of the plurality of sidewall forming processes, comprising:
computer readable code for depositing a protective layer on the patterned photoresist mask by performing a plurality of cyclical depositions;
computer readable code for performing one of the plurality of cyclical depositions, comprising:
computer readable code for a depositing phase for depositing a deposition layer over surfaces of the patterned photoresist mask; and
computer readable code for a profile shaping phase for shaping vertical surfaces in the deposition layer; and
computer readable code for selectively etching horizontal surfaces of the protective layer with respect to vertical surfaces of the deposition layer; and
computer readable code for etching the etch layer to form a feature therein, the feature in the etch layer having a second critical dimension that is less than the first critical dimension.

12. The apparatus, as recited in claim 11, further comprising:
computer readable code for flowing a depositing gas;
computer readable code for forming the depositing gas into a plasma; and
computer readable code for stopping the flow of the depositing gas.

13. The apparatus, as recited in claim 12, further comprising:
computer readable code for flowing a profile shaping gas;
computer readable code for forming the profile shaping gas into a plasma; and
computer readable code for stopping the flow of the profile shaping gas.

14. The apparatus, as recited in claim 13, further comprising:
computer readable code for flowing a breakthrough gas;
computer readable code for forming the breakthrough gas into a plasma; and
computer readable code for stopping the flow of the breakthrough gas.

15. The apparatus, as recited in claim 14, further comprising computer readable code for the selective etching of the horizontal surfaces of the protective layer with respect to the vertical surfaces of the deposition layer such that portions of the protective layer overlying a horizontal surface of the patterned photoresist mask are completely removed.

16. The apparatus, as recited in claim 14, further comprising computer readable code for the selective etching of the horizontal surfaces of the protective layer with respect to vertical surfaces of the deposition layer such that portions of the protective layer overlying a horizontal surface of the patterned photoresist mask are partially removed.

17. The apparatus, as recited in claim 16, wherein the protective layer has sidewalls with a thickness between 5 nm and 30 nm.

18. The apparatus, as recited in claim 16, wherein the second critical dimension is at least approximately 50% less than the first critical dimension.

19. The apparatus, as recited in claim 16, further comprising computer readable code for forming the protective layer on top of the patterned photoresist mask.

20. The apparatus, as recited in claim 16, further comprising computer readable code for removing the protective layer and photoresist mask.

21. The apparatus, as recited in claim 16, further comprising a plurality of radio frequency (RF) sources that are electrically coupled with one of the at least one electrodes, the plurality of RF sources including a 27 MHz power source, a 2 MHz power source and a 60 MHz power source.

22. The method, as recited in claim 1, wherein the selective etching of the horizontal surfaces of the protective layer involves etching open area portions of the protective layer that are outside the photoresist features without etching any material underlying the protective layer.

* * * * *